United States Patent
Li et al.

(10) Patent No.: US 7,888,980 B2
(45) Date of Patent: Feb. 15, 2011

(54) CHARGE PUMP WITH LOW CHARGE INJECTION AND LOW CLOCK FEED-THROUGH

(75) Inventors: Larry Baoqi Li, Irvine, CA (US); Huaimao Sheng, Shanghai (CN)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/505,829

(22) Filed: Jul. 20, 2009

(65) Prior Publication Data

US 2011/0012653 A1    Jan. 20, 2011

(51) Int. Cl.
*H03L 7/06* (2006.01)

(52) U.S. Cl. .................... 327/157; 327/148

(58) Field of Classification Search ............. 327/148, 327/157
See application file for complete search history.

(56) References Cited

U.S. PATENT DOCUMENTS

| | | | | |
|---|---|---|---|---|
| 5,646,563 A * | 7/1997 | Kuo | ............ | 327/157 |
| 5,734,279 A * | 3/1998 | Bereza | ............ | 327/112 |
| 5,818,287 A * | 10/1998 | Chow | ............ | 327/536 |
| 6,075,406 A * | 6/2000 | Lee et al. | ............ | 327/538 |
| 6,118,346 A * | 9/2000 | Olgaard | ............ | 331/17 |
| 6,222,402 B1 * | 4/2001 | Boerstler et al. | ............ | 327/157 |
| 6,285,224 B1 | 9/2001 | Lin et al. | | |
| 6,586,976 B2 | 7/2003 | Yang | | |
| 6,611,160 B1 * | 8/2003 | Lee et al. | ............ | 327/157 |
| 6,717,446 B1 * | 4/2004 | Vu | ............ | 327/157 |
| 6,838,951 B1 * | 1/2005 | Nieri et al. | ............ | 331/177 V |
| 6,980,046 B2 * | 12/2005 | Soe | ............ | 327/536 |
| 7,002,393 B2 * | 2/2006 | Yeh | ............ | 327/337 |
| 7,161,401 B2 * | 1/2007 | Li | ............ | 327/157 |
| 7,190,231 B2 * | 3/2007 | Park | ............ | 331/17 |
| 7,202,717 B2 * | 4/2007 | Keaveney et al. | ............ | 327/157 |
| 7,250,808 B2 * | 7/2007 | Yoshimura | ............ | 327/536 |
| 7,265,636 B2 * | 9/2007 | Dedieu et al. | ............ | 331/17 |
| 7,271,645 B2 * | 9/2007 | Park | ............ | 327/536 |
| 7,385,429 B1 * | 6/2008 | Mei et al. | ............ | 327/157 |
| 7,471,127 B2 * | 12/2008 | Wu | ............ | 327/157 |
| 7,492,196 B2 * | 2/2009 | Lever | ............ | 327/157 |
| 7,583,116 B2 * | 9/2009 | Wyatt et al. | ............ | 327/157 |
| 7,705,641 B2 * | 4/2010 | Wu et al. | ............ | 327/157 |
| 7,768,326 B2 * | 8/2010 | Kaneko | ............ | 327/157 |
| 7,812,652 B2 * | 10/2010 | Mei | ............ | 327/156 |
| 2001/0052806 A1 * | 12/2001 | Gu et al. | ............ | 327/157 |
| 2001/0052811 A1 * | 12/2001 | Kim | ............ | 327/536 |
| 2002/0149407 A1 * | 10/2002 | Ingino, Jr. | ............ | 327/157 |
| 2003/0155951 A1 * | 8/2003 | Bushey et al. | ............ | 327/157 |

(Continued)

*Primary Examiner*—Lincoln Donovan
*Assistant Examiner*—Adam D Houston

(57) ABSTRACT

A charge pump with low charge injection and low clock feed-through for a phase locked loop (PLL). A first source-switched current mirror has a source transistor and an output transistor. The source transistor has a drain connected to a first current source. The output transistor has a drain connected to an output of the charge pump. The gates of the source and output transistors are coupled together by a first conductive link. A switch is coupled between a supply voltage source and a source of the output transistor of the current mirror. A tuner is coupled between the switch and the output transistor of the current mirror. A source of the tuner is coupled to a drain of the switch and to the source of the output transistor. A drain of the tuner is coupled to the first conductive link between the source and output transistors of the current mirror.

20 Claims, 5 Drawing Sheets

U.S. PATENT DOCUMENTS

| | | | |
|---|---|---|---|
| 2003/0231037 A1* | 12/2003 | Lee et al. ................... | 327/157 |
| 2005/0017776 A1* | 1/2005 | Keaveney et al. ........... | 327/157 |
| 2007/0075755 A1* | 4/2007 | Park .......................... | 327/157 |
| 2008/0157834 A1* | 7/2008 | Lin ............................ | 327/157 |
| 2009/0033383 A1* | 2/2009 | Wyatt et al. ................ | 327/157 |
| 2010/0085092 A1* | 4/2010 | Shin .......................... | 327/157 |

* cited by examiner

CHARGE PUMP WITH LOW CHARGE INJECTION AND LOW CLOCK FEED-THROUGH

BACKGROUND

Phase locked loop (PLL) circuits are used in many types of electronic devices and systems. PLL circuits are typically used in devices to generate clock and other reference signals. Examples of applications that use PLL circuits include clock signal generation, clock sampling, signal synchronization, frequency synthesis, and so forth.

A conventional PLL circuit includes a phase detector, a charge pump, a loop filter, a voltage controlled oscillator (VCO), and a loop divider. For convenience, the designation PFD is used herein to refer generally to a phase detector or more specifically to a phase frequency detector. The PFD compares an input reference signal to an output signal generated by the VCO. Depending on the phase difference between the reference signal and the output signal generated by the VCO, the PFD controls the charge pump to charge or discharge a load capacitor within the loop filter. The charge on the load capacitor within the loop filter generates an output voltage, which is used by the VCO to generate the output signal. As the output signal is fed back to the PFD via the loop divider, the PLL circuit continues to adjust the charge on the load capacitor in the loop filter and, thereby, change the output signal to match the input reference signal.

Because the operation of the charge pump has a direct effect on the charge of the load capacitor in the loop filter, which influences the quality of the output signal that is generated, the operation of the charge pump can result in spurious noise in the generated output signal of the PLL circuit. Specifically, the charge pump can cause spurious noise in the output signal through charge injection, clock feed-through, and up/down current mismatch.

FIG. 1 depicts a conventional charge pump circuit 10. The illustrated charge pump circuit 10 includes two p-channel metal-oxide semiconductor (PMOS) transistors M1 and M2 arranged in a current mirror configuration. Similarly, two n-channel MOS (NMOS) transistors M3 and M4 are arranged in another current mirror configuration. The two current mirrors provide charge and discharge (or pump) current, respectively, to the loop filter (not shown). The current corresponding to the charge current mirror (including the PMOS transistors M1 and M2) is designated as Iup, and the current corresponding to the discharge current mirror (including the NMOS transistors M3 and M4) is designated as Idn. Two additional transistors M5 (PMOS) and M6 (NMOS) serve as corresponding switches for the charge and discharge current mirrors. Parasitic capacitances of the MOS switching devices M5 and M6 are designated as Cgsp, Cgdp, Cgsn, and Cgdn. Since the MOS switching devices M5 and M6 are coupled to the drains of the corresponding current mirror transistors, this configuration is generally referred to as a drain-switched current mirror configuration.

The MOS switching devices M5 and M6 are operated by control signals UN and DP that are generated by the PFD (not shown). In this way, the PFD controls the charge pump to charge or discharge the loop filter. When the control signals change from HIGH to LOW or LOW to HIGH, this state transition causes a voltage swing at the charge pump output because of coupling of the parasitic capacitances (i.e., Cgsp, Cgdp, Cgsn, and/or Cgdn) of the MOS switching devices M5 and M6. This voltage swing is called clock feed-through. Also, when the MOS switching devices M5 and M6 are turned off, the charge in the depletion region of the channel will be injected to the load capacitor of the charge pump and cause unwanted voltage swing at the charge pump output. This voltage swing is called charge injection. The spurious noise associated with clock feed-through and charge injection due to the operation of the charge pump decreases the quality of the output signal generated by the PLL circuit.

SUMMARY

Embodiments of an apparatus are described. In one embodiment, the apparatus is a charge pump with low charge injection and low clock feed-through for a phase locked loop (PLL). One embodiment of the charge pump includes a first source-switched current mirror, a PMOS switch, and a PMOS tuner. The first current mirror includes a source PMOS transistor and an output PMOS transistor. The source PMOS transistor has a drain connected to a first current source. The output PMOS transistor has a drain connected to an output of the charge pump. The gates of the source and output PMOS transistors are coupled together by a first conductive link. The PMOS switch is coupled between a supply voltage source and a source of the output PMOS transistor of the first current mirror. The PMOS tuner is coupled between the PMOS switch and the output PMOS transistor of the first current mirror. A source of the PMOS tuner is coupled to a drain of the PMOS switch and to the source of the output PMOS transistor. And a drain of the PMOS tuner is coupled to the first conductive link between the source and output PMOS transistors of the first current mirror. Further embodiments of the charge pump include corresponding NMOS devices coupled together in corresponding arrangements to implement complementary discharge functionality. Other embodiments of the charge pump circuit are also described.

Embodiments of a system are also described. In one embodiment, the system is a PLL. One embodiment of the PLL includes a loop filter, a voltage controlled oscillator, a detector, and a charge pump. The loop filter generates an output voltage. The voltage controlled oscillator is coupled to an output of the loop filter. The voltage controlled oscillator generates an output signal with a known relationship to an input reference signal. The voltage controlled oscillator generates the output signal based on the output voltage from the loop filter. The detector is coupled to an output of the voltage controlled oscillator to compare the output signal and the input reference signal. The detector also outputs at least one control signal to adjust the output signal generated by the voltage controlled oscillator. The charge pump is coupled between an output of the detector and an input of the loop filter to charge and discharge a load capacitor within the loop filter in response to the control signals from the detector. In one embodiment, the charge pump includes first and second current mirrors to serve as separate charge and discharge current sources. Each current mirror includes a source MOS transistor and an output MOS transistor. The charge pump also includes MOS tuners coupled to the first and second current mirrors, and each MOS tuner includes a transistor with a source coupled to a source of the corresponding output MOS transistor, and a drain coupled to a gate of the corresponding output MOS transistor. Other embodiments of the PLL circuit are also described.

Embodiments of a method are also described. In one embodiment, the method is a method for operating a charge pump of a PLL. The method includes receiving a first tuning control signal. The method also includes turning on a PMOS tuner in response to the first tuning control signal. The PMOS tuner includes a PMOS transistor with: 1) a source coupled to a source of an output PMOS transistor of a source-switched charging current mirror, and 2) a drain coupled to a gate of the output PMOS transistor of the source-switched charging current mirror. The method also includes receiving a charge control signal. The method also includes turning on a PMOS switch while the PMOS tuner is turned on. The PMOS switch is coupled to the source of the PMOS tuner and to the source of the output PMOS transistor of the source-switched charging current mirror. Turning on the PMOS switch facilitates charging a load capacitor within a loop filter of the PLL. Further embodiments of the method include corresponding operations for discharging the load capacitor within the loop filter of the PLL. Other embodiments of the method are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
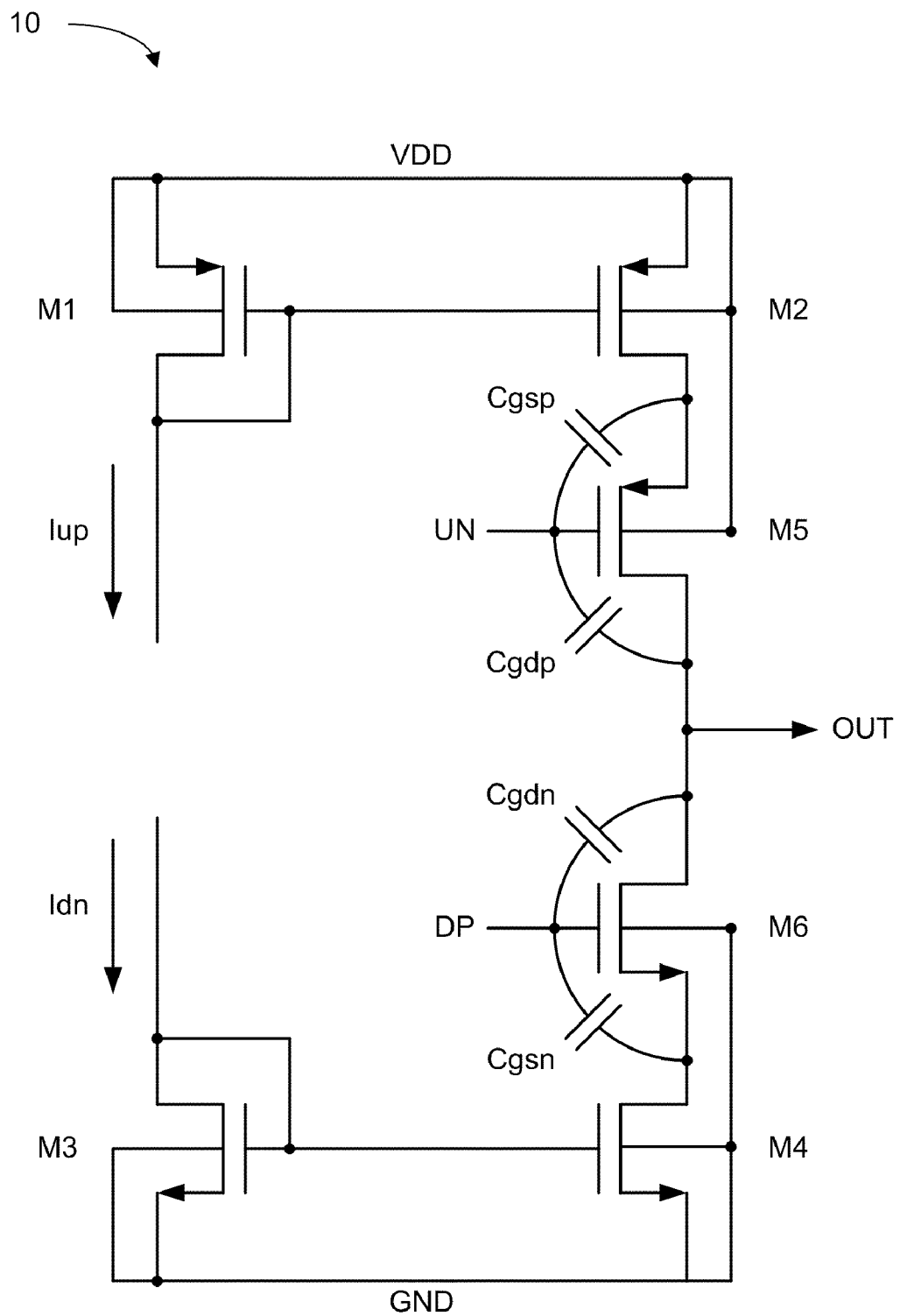
FIG. 1 depicts a conventional charge pump circuit.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments implement a charge pump which reduces or eliminates typical spurious noise caused by clock feed-through, charge injection, and/or other sources of noise. In a particular embodiment, a charge pump circuit with two current mirror circuits includes MOS devices functioning as current sources. MOS switching devices receive control signals from a PFD to turn on and off the current mirror circuits. MOS tuning devices receive additional control signals from the PFD to turn on when the MOS switching devices turn off. In this way, the charge pump output gets better isolation from the switching MOS devices. Moreover, voltage swings caused by clock feed-through and charge injection may be partially or completely filtered out.

Figure 2:
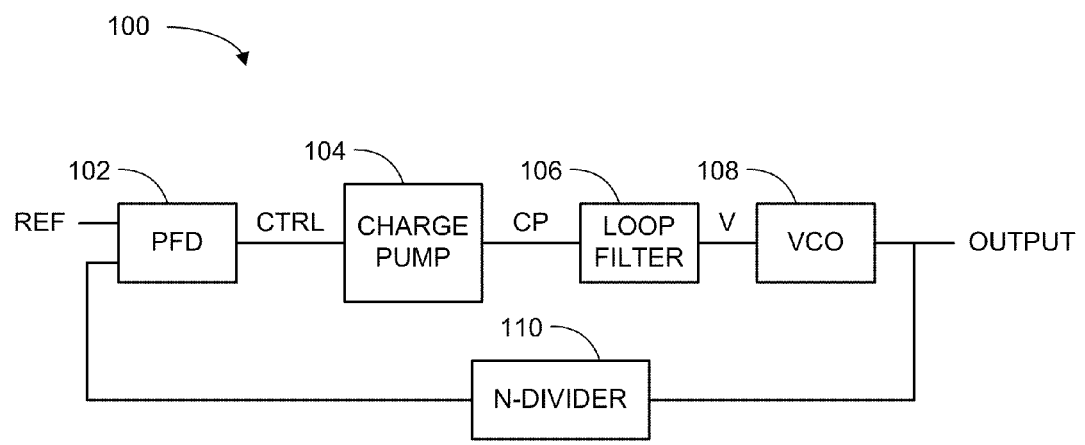
FIG. 2 depicts a schematic block diagram of one embodiment of a PLL circuit that facilitates operation with low spurious noise from clock feed-through and charge injection.

FIG. 2 depicts a schematic block diagram of one embodiment of a PLL circuit 100 that facilitates operation with low spurious noise from clock feed-through and charge injection. The illustrated PLL circuit 100 includes a phase frequency detector (PFD) 102, a charge pump 104, a loop filter 106, a voltage controlled oscillator (VCO) 108, and an N-divider 110. Although the PLL circuit 100 is shown and described with certain components and functionality, other embodiments of the PLL circuit 100 may include fewer or more components to implement less or more functionality. For example, some embodiments of the PLL circuit 100 may include a phase detector, instead of the PFD 102.

In general, the PLL circuit 100 receives an input reference signal, REF, and generates an output signal, OUT, which has a known relationship to the input reference signal. For example, the PLL circuit 100 may generate the output signal to replicate the input reference signal. As another example, the PLL circuit 102 may generate the output signal with a frequency that is proportional to the frequency of the input reference signal. Other known relationships between the output signal and the input reference signal are known and, hence, are not described in more detail herein.

In order to generate the output signal, the PFD 102 monitors the phase and/or frequency differences between the input reference signal and the output signal (which is fed back through the N-divider 110 along a feedback path from the VCO 108 to the PFD 102). Depending on the differences between the input reference signal and the output signal, the PFD 102 generates one or more control signals, CTRL, and transmits those control signals over corresponding control lines to the charge pump 104.

The charge pump 104 generates a current, CP, to either charge or discharge a load capacitor (not shown) in the loop filter 106. More specifically, the charge pump 104 generates a charge current to charge the load capacitor or a discharge current to discharge the load capacitor.

The charging and discharging of the load capacitor in the loop filter 106 influences an output voltage, V, of the loop filter 106. The output voltage is conveyed to an input of the VCO 108. In response to the output voltage from the loop filter 106, the VCO 108 changes the phase and/or frequency of the generated output signal. In this way, the PLL circuit 100 continually monitors the input reference signal and modifies the generated output signal to match (or otherwise depend from) the characteristics of the input reference signal.

Figure 3:
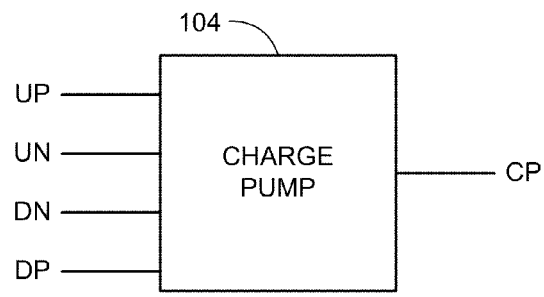
FIG. 3 depicts a schematic block diagram of another embodiment of the charge pump and the control signals from the PFD within the PLL circuit of FIG. 2.

FIG. 3 depicts a schematic block diagram of another embodiment of the charge pump 104 and the control signals from the PFD 102 within the PLL circuit 100 of FIG. 2. In the illustrated embodiment, the charge pump 104 receives four separate control signals from the PFD 102. These control signals are designated as UP, UN, DN, and DP. For reference, the UP control signal indicates that the output voltage of the loop filter 106 is to be increased. In contrast, the DN control signal indicates that the output voltage of the loop filter 106 is to be decreased. In some embodiments, the UN and DP control signals are merely logical inverses of the UP and DN control signals, respectively.

Also, the control signals may be used as either active high or active low control signals, depending on the types of components the control signals are used to assert. In one embodiment, integrated circuit components that use active high logical devices may use the DN and DP control signals for activation, while integrated circuit components that use active low logical devices may use the UP and UN control signals for activation. Although the embodiments are described herein using a particular signal convention, other embodiments may be implemented which use other signal conventions and/or logical states.

As explained above, the charge pump 104 generates a current, CP, which is used by the loop filter 106 to change the output voltage used by the VCO 108. Although the references herein to charging and discharging the load capacitor of the loop filter 106 may imply certain signal conventions, the operation of the charge pump 104 in some embodiments is not limited to the signal conventions referenced or implied herein.

Figure 4:
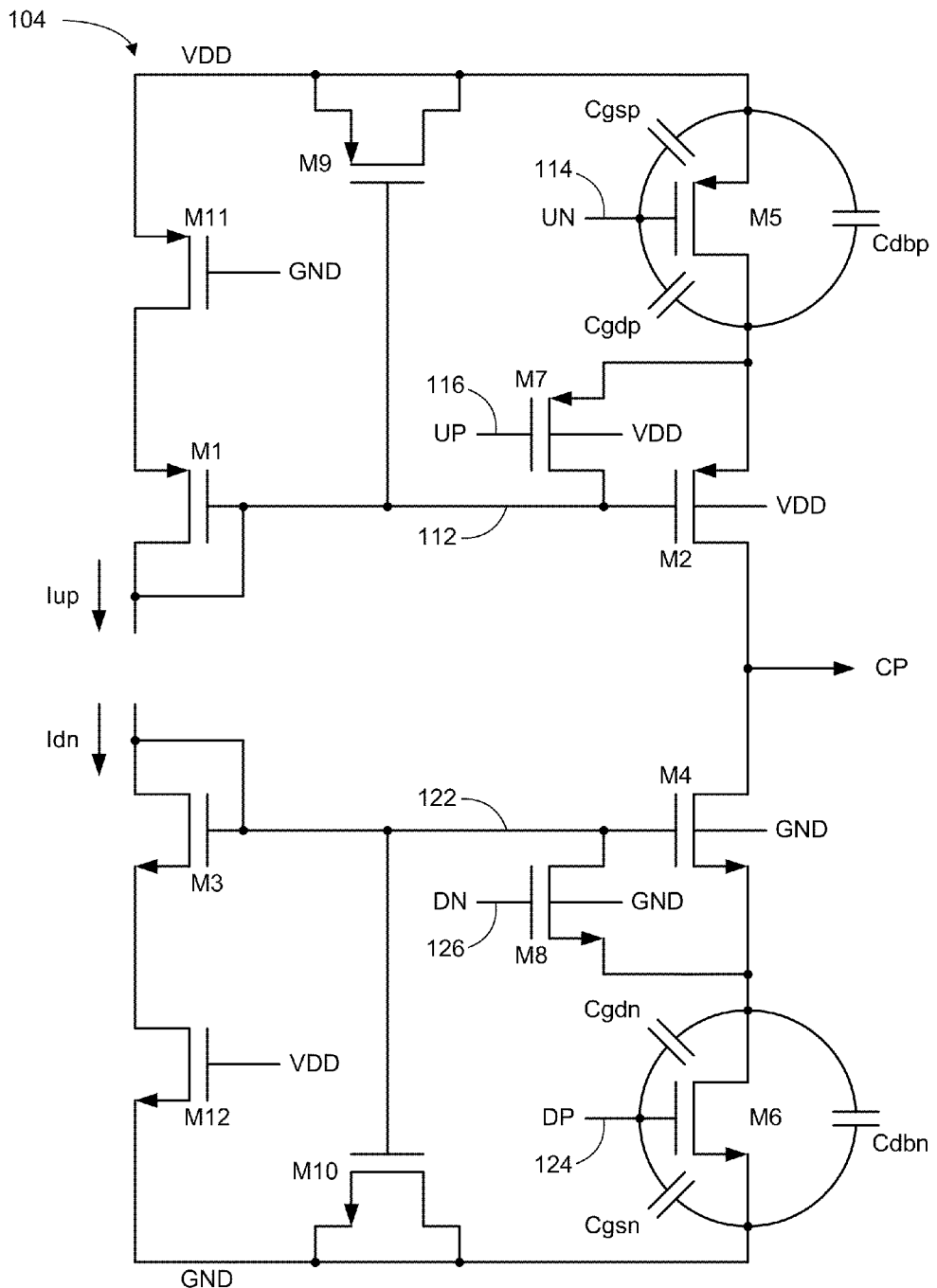
FIG. 4 depicts a schematic circuit diagram of one embodiment of a charge pump for use in the PLL circuit of FIG. 2.

FIG. 4 depicts a schematic circuit diagram of one embodiment of a charge pump 104 for use in the PLL circuit 100 of FIG. 2. The illustrated charge pump 104 includes several integrated circuit components, including PMOS and NMOS transistors, to generate the current, CP, used by the loop filter 106. Although the charge pump 104 is shown and described with certain components and functionality, other embodiments of the charge pump 104 may include fewer or more components to implement less or more functionality. Additionally, some embodiments of the charge pump 104 may be implemented with circuitry components other than PMOS and NMOS transistors. For example, other types of transistors may be arranged in a similar configuration to implement the same or similar functionality. Hence, the scope of the description herein is not limited to specific PMOS or NMOS technology referenced herein.

The illustrated charge pump 104 is coupled to a supply voltage source, VDD, and a reference voltage, GND. The specific values or ranges of values that may be acceptable for the supply voltage source and the reference voltage source are dictated by the specific type of technology that is used to implement the individual components of the illustrated circuit. Also, connections to the supply voltage source and/or the reference voltage may be made using any conventional techniques to deliver the same or different voltage levels to each of the various components of the illustrated circuit.

The charge pump 104 also includes several PMOS and NMOS transistors. The PMOS transistors are designated as M1, M2, M5, M7, M9, and M11. In the illustrated embodiment, the PMOS transistors are used to implement the charging functions of the charge pump 104. The NMOS transistors are designated as M3, M4, M6, M8, M10, and M12. In the illustrated embodiment, the NMOS transistors are used to implement the discharging functions of the charge pump 104.

For reference, some of the transistor symbols used for the PMOS and NMOS transistors shown in FIG. 4 are simplified to eliminate the substrate connections in cases where the substrate is coupled with the source node of the transistor. However, in cases where the substrate is connected to a voltage level that may be different from the source node, the substrate connections and the corresponding voltage levels are shown. The following Table 1 outlines the transistors that are used for various functions within the depicted charge pump 104.

TABLE 1

Transistor functions.

| FUNCTION | PMOS (Charge) | NMOS (Discharge) |
| --- | --- | --- |
| Current mirror | M1 and M2 | M3 and M4 |
| Tuners | M5 | M6 |
| Switches | M7 | M8 |
| Capacitors | M9 | M10 |
| Match | M11 | M12 |

The illustrated charge pump 104 includes two source-switched current mirrors. Each current mirror includes a source transistor M1 or M3 and an output transistor M2 or M4. For reference, each current mirror can be referenced by the corresponding pair of transistors that are coupled together (e.g., first current mirror M1-M2, and second current mirror M3-M4). The source transistors M1 and M3 are connected to corresponding current sources, which are designated as Iup and Idn. The output transistors M2 and M4 are connected at drain nodes to the output channel of the charge pump 104. The gates of the output transistors M2 and M4 are coupled to the gates of the corresponding source transistors M1 and M3 via conductive links 112 and 122.

The first current mirror M1-M2 is used during a charging mode of the charge pump 104. The second current mirror M3-M4 is used during a discharge mode of the charge pump 104. The current mirrors are referred to as source-switched current mirrors because the corresponding switches M5 and M6 are coupled to the source nodes of the output transistors M2 and M4 within the current mirrors. In particular, the PMOS switch M5 is coupled between the supply voltage source and the source node of the output PMOS transistor M2. Similarly, the NMOS switch M6 is coupled between the reference voltage connection and the source node of the output NMOS transistor M4. Parasitic capacitances Cgsp, Cgdp, Cdbp, Cgdn, Cgsn, and Cdbn are associated the MOS switching devices M5 and M6. By coupling the MOS switching devices M5 and M6 to the source nodes of the corresponding output transistors M2 and M4, the MOS switching devices M5 and M6 can be isolated from the output channel of the charge pump 104. By turning on the MOS tuners M7 and M8 when the corresponding MOS switching devices M5 and M6 turn off, the MOS switching devices M5 and M6 can turn off more quickly and provide better isolation from the output channel of the charge pump 104. This isolation helps to limit the spurious noise from the parasitic capacitances during the operation of the MOS switching devices M5 and M6.

The MOS tuners M7 and M8 are also coupled to the output transistors M2 and M4 of the current mirrors. In particular, the source node of the PMOS tuner M7 is coupled to the source node of the output PMOS transistor M2 (and also to the drain node of the PMOS switch M5). The drain node of the PMOS tuner M7 is coupled to the gate node of the output PMOS transistor M2 of the charging current mirror. By connecting the PMOS tuner M7 across the source and gate nodes of the output PMOS transistor M2, in this manner, the PMOS tuner M7 can act as a switch to connect the source and gate nodes of the output PMOS transistor M2. This allows the PMOS tuner M7 to turn off the output PMOS transistor M2 faster, so that the isolation from the PMOS switch M5 to the output channel of the charge pump 104 is increased relative to a conventional charge pump.

In a similar arrangement, the source node of the NMOS tuner M8 is coupled to the source node of the output NMOS transistor M4 (and the drain node of the NMOS switch M6). The drain node of the NMOS tuner M8 is coupled to the gate node of the output NMOS transistor M4 of the discharging current mirror. By connecting the NMOS tuner M8 across the source and gate nodes of the output NMOS transistor M4, in this manner, the NMOS tuner M8 can act as a switch to connect the source and gate nodes of the output NMOS transistor M4. This allows the NMOS tuner M8 to turn off the output NMOS transistor M4 faster, so that the isolation from the NMOS switch M6 to the output channel of the charge pump 104 is increased relative to a conventional charge pump.

FIG. 4 also shows that the substrates of the output PMOS transistor M2 and the PMOS tuner M7 are connected to the supply voltage source. Similarly, the substrates of the output NMOS transistor M4 and the NMOS tuner M8 are connected to the reference voltage connection. Hence, the substrates of these transistors M2, M4, M7, and M8 are not connected to the corresponding source nodes.

The MOS switches M5 and M6 and the MOS tuners M7 and M8 are individually controlled by the control signals from the PFD 102. In order to facilitate such control, the PFD 102 may be coupled to each of the MOS switches M5 and M6 and the MOS tuners M7 and M8 via individual control lines. In the depicted embodiment, the PFD 102 is connected to the MOS switches M5 and M6 by switch control lines 114 and 124. Similarly, the PFD 120 is connected to the MOS tuners M7 and M8 by the tuner control lines 116 and 126. The following Table 2 summarizes the control signals used for the various transistors within the charge pump 104.

TABLE 2

Transistor control signals.

| FUNCTION | CONTROL SIGNAL | TRANSISTOR |
| --- | --- | --- |
| Charge Tuner | UP | M7 |
| Charge Switch | UN | M5 |
| Discharge Tuner | DN | M8 |
| Discharge Switch | DP | M6 |

As explained above with reference to FIG. 3, in some embodiments the UN control signal is the logical inverse of the UP control signal (i.e., UN=/UP), and the DP control signal is the logical inverse of the DN control signal (i.e., DP=/DN). However, even though there may be some logical relationship between the control signals generated by the PFD 102, the PFD 102 may communicate the control signals to various components of the charge pump 104 at different times. Examples of the timing of these control signals are shown in FIGS. 5 and 6 and described in more detail below.

The illustrated charge pump 104 also includes MOS capacitors M9 and M10. In general, the MOS capacitors M9 and M10 can at least partially filter out spurious noise caused by clock feed-through and/or charge injection cause by voltage swings at the drain nodes of the corresponding MOS switching devices M5 and M6. More specifically, when the MOS tuners M7 and M8 turn on, the voltage swing on the drain nodes of the MOS switches M5 and M6 will be filtered by the MOS capacitors M9 and M10 through the MOS tuners M7 and M8, respectively.

The illustrated charge pump 104 also includes MOS matching transistors M11 and M12. In general, the MOS matching transistors M11 and M12 operate to match the voltage drops that occur over the corresponding MOS switching devices M5 and M6.

Figure 5:
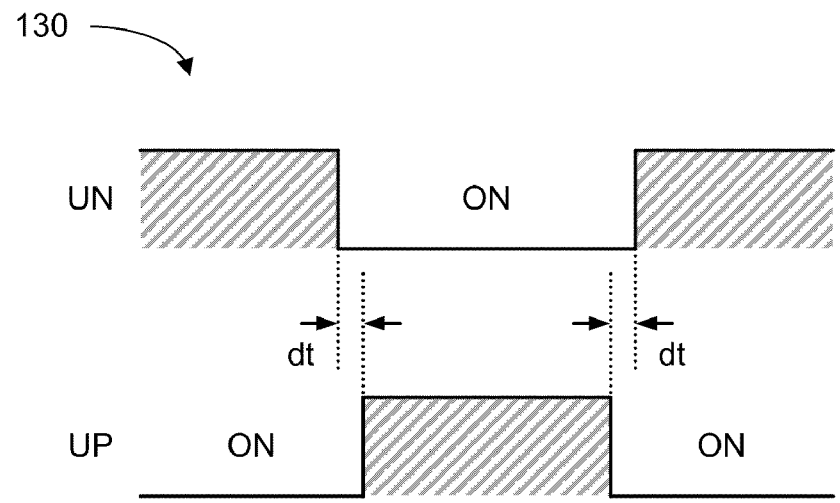
FIG. 5 depicts a schematic timing diagram of one embodiment of control signals generated by the PFD and used by the charge pump to charge the load capacitor of the loop filter within the PLL circuit of FIG. 2.
Figure 6:
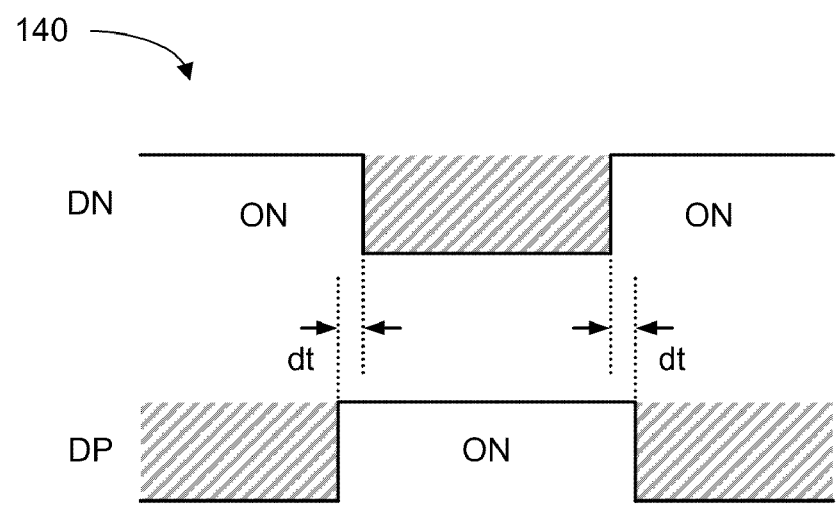
FIG. 6 depicts a schematic timing diagram of one embodiment of control signals generated by the PFD and used by the charge pump to discharge the load capacitor of the loop filter within the PLL circuit of FIG. 2.

FIG. 5 depicts a schematic timing diagram 130 of one embodiment of control signals generated by the PFD 102 and used by the charge pump 104 to charge the load capacitor of the loop filter 106 within the PLL circuit 100 of FIG. 2. In the embodiment described herein, the UN and UP control signals are active low control signals, so the corresponding devices are asserted when the UN and UP control signals are low. For visual reference, the high values of the control signals are shown hashed to indicate that the corresponding devices are in deasserted states.

As explained above, the UN control signal is used to control the PMOS switch M5, and the UP control signal is used to control the PMOS tuner M7. In general, the PMOS tuner M7 is turned on whenever the PMOS switch M5 is turned off or is transitioning from one state to the other state (i.e., ON-to-OFF, or OFF-to-ON). In the depicted embodiment, the PMOS tuner M7 stays on for a time period, dt, following the OFF-to-ON transition of the PMOS switch M5. Similarly, the PMOS tuner M7 turns on for a time period, dt, prior to the ON-to-OFF transition of the PMOS switch M5.

FIG. 6 depicts a schematic timing diagram 140 of one embodiment of control signals generated by the PFD 102 and used by the charge pump 104 to discharge the load capacitor of the loop filter 106 within the PLL circuit 100 of FIG. 2. In the embodiment described herein, the DP and DN control signals are active high control signals, so the corresponding devices are asserted when the DP and DN control signals are high. For visual reference, the low values of the control signals are shown hashed to indicate that the corresponding devices are in deasserted states.

As explained above, the DP control signal is used to control the NMOS switch M6, and the DN control signal is used to control the NMOS tuner M8. In general, the NMOS tuner M8 is turned on whenever the NMOS switch M6 is turned off or is transitioning from one state to the other state (i.e., ON-to-OFF, or OFF-to-ON). In the depicted embodiment, the NMOS tuner M8 turns on for a time period, dt, prior to the ON-to-OFF transition of the NMOS switch M6. Similarly, the NMOS tuner M8 stays on for a time period, dt, following the OFF-to-ON transition of the NMOS switch M6.

While the timing schemes shown in FIGS. 5 and 6 and described above correspond to one embodiment for implementing the charging and discharging modes of the charge pump 104, other embodiments may use other timing schemes.

Figure 7:
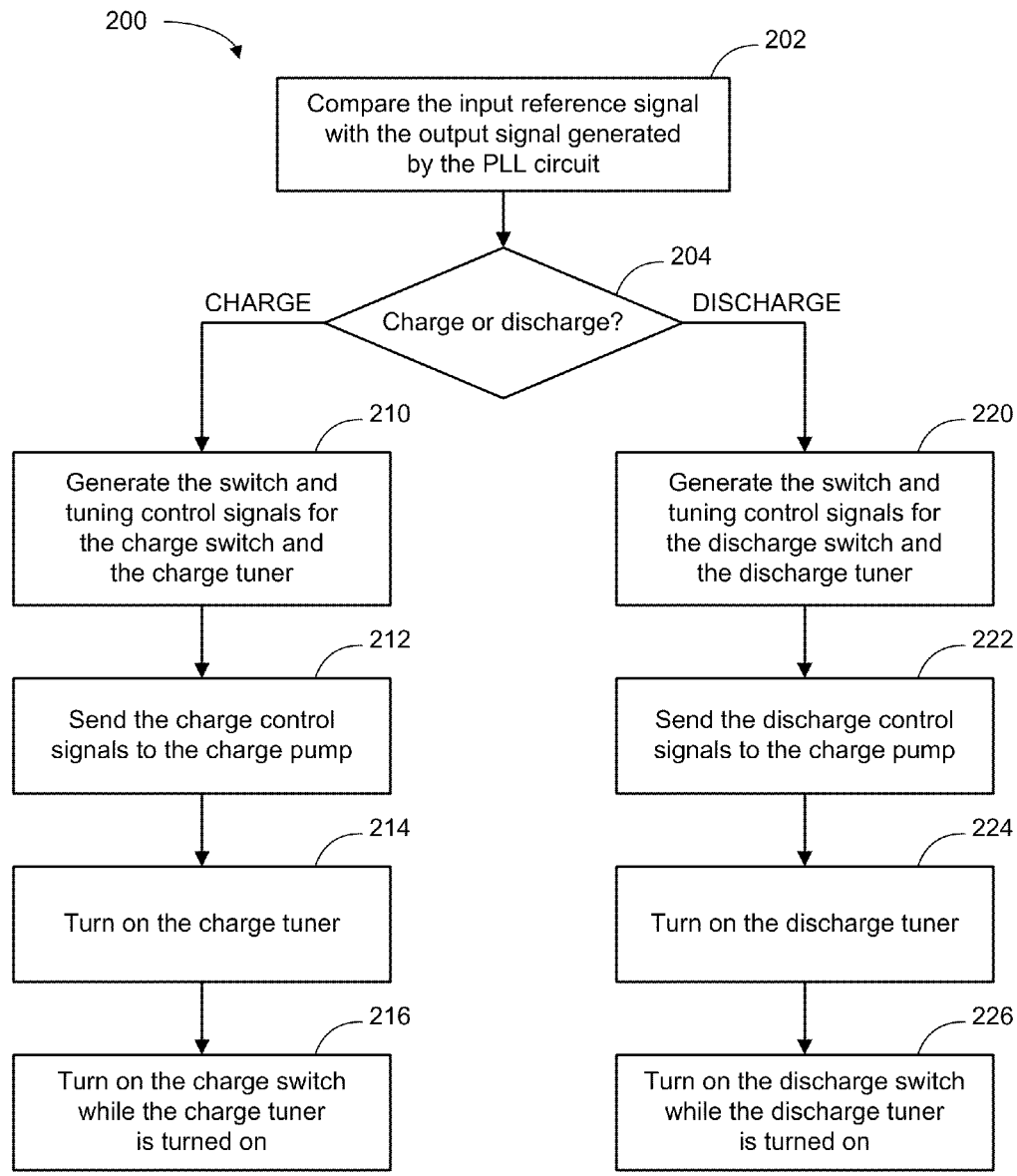
FIG. 7 depicts a schematic flow chart diagram of one embodiment of a method for operating the PLL circuit of FIG. 2 to reduce spurious noise from clock feed-through and charge injection.

FIG. 7 depicts a schematic flow chart diagram of one embodiment of a method 200 for operating the PLL circuit 100 of FIG. 2 to reduce spurious noise from clock feed-through and charge injection. Although the method 200 is described in conjunction with the PLL circuit 100 of FIG. 2, embodiments of the method 200 may be implemented with other types of PLL circuits.

At block 202, the PFD 102 compares the input reference signal with the output signal generated by the PLL circuit 100. At block 204, the PFD 102 determines whether to charge or discharge the load capacitor of the loop filter 106. If the PFD 102 determines to charge the load capacitor of the loop filter 106, then at block 210 the PFD 102 generates the switch and tuning control signals, UN and UP, for the PMOS switch M5 and the PMOS tuner M7. At block 212, the PFD 102 sends the charge control signals, UN and UP, to the charge pump 104. Although referenced together, these charge control signals, UN and UP, may be sent to the charge pump 104 at different times. In one embodiment, the UP control signal is sent to the charge pump 104 before the UN control signal is sent to the charge pump 104. In response to receiving the tuning control signal, UP, at block 214 the charge pump 104 turns on the PMOS tuner M7. Then at block 216, the charge pump 104 turns on the PMOS switch M5 while the PMOS tuner M7 is turned on. Turning off the PMOS switch M5 and t off the PMOS tuner M7 occur in the reverse order.

If the PFD 102 determines to discharge the load capacitor of the loop filter 106, rather than to charge the load capacitor, then at block 220 the PFD 102 generates the switch and tuning control signals, DP and DN, for the NMOS switch M6 and the NMOS tuner M8. At block 222, the PFD 102 sends the discharge control signals, DP and DN, to the charge pump 104. Although referenced together, these discharge control signals, DP and DN, may be sent to the charge pump 104 at different times. In one embodiment, the DN control signal is sent to the charge pump 104 before the DP control signal is sent to the charge pump 104. In response to receiving the tuning control signal, DN, at block 224 the charge pump 104 turns on the NMOS tuner M8. Then at block 226, the charge pump 104 turns on the NMOS switch M6 while the NMOS tuner M8 is turned on. Turning off the NMOS switch M6 and turning off the NMOS tuner M8 occur in the reverse order. The depicted method 200 then ends.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A charge pump for a phase locked loop (PLL), the charge pump comprising:
   a first source-switched current mirror comprising:
   a source PMOS transistor having a drain connected to a first current source;
   an output PMOS transistor having a drain connected to an output of the charge pump, wherein gates of the source and output PMOS transistors are coupled together by a first conductive link;
   a PMOS switch coupled between a supply voltage source and a source of the output PMOS transistor of the first current mirror; and
   a PMOS tuner coupled between the PMOS switch and the output PMOS transistor of the first current mirror, wherein a source of the PMOS tuner is coupled to a drain of the PMOS switch and to the source of the output PMOS transistor, and a drain of the PMOS tuner is coupled to the first conductive link between the source and output PMOS transistors of the first current mirror.

2. The charge pump of claim 1, further comprising:
   a second source-switched current mirror comprising:
   a source NMOS transistor having a drain connected to a second current source;
   an output NMOS transistor having a drain connected to the output of the charge pump, wherein gates of the source and output NMOS transistors are coupled together by a second conductive link;
   an NMOS switch coupled between a reference voltage connection and a source of the output NMOS transistor of the second current mirror; and
   an NMOS tuner coupled between the NMOS switch and the output NMOS transistor of the second current mirror, wherein a source of the NMOS tuner is coupled to a drain of the NMOS switch and to the source of the output NMOS transistor, and a drain of the NMOS tuner is coupled to the second conductive link between the source and output NMOS transistors of the second current mirror.

3. The charge pump of claim 2, further comprising:
   a PMOS switch control line coupled to a gate of the PMOS switch, wherein the PMOS switch control line is configured to deliver a charge control signal, UN, to the gate of the PMOS switch to turn on a charge mode of the charge pump; and
   an NMOS switch control line coupled to a gate of the NMOS switch, wherein the NMOS switch control line is configured to deliver a discharge control signal, DP, to the gate of the NMOS switch to turn on a discharge mode of the charge pump.

4. The charge pump of claim 3, further comprising:
   a PMOS tuner control line coupled to a gate of the PMOS tuner, wherein the PMOS tuner control line is configured to deliver a first tuning control signal, UP, to the gate of the PMOS tuner to turn on the PMOS tuner during a state transition of the PMOS switch; and
   an NMOS tuner control line coupled to a gate of the NMOS tuner, wherein the NMOS tuner control line is configured to deliver a second tuning control signal, DN, to the gate of the NMOS tuner to turn on the NMOS tuner during a state transition of the NMOS switch.

5. The charge pump of claim 4, wherein the first tuning control signal, UP, is a logical inverse of the charge control signal, UN, and the second tuning control signal, DN, is a logical inverse of the discharge control signal, DP.

6. The charge pump of claim 4, wherein the charge, discharge, and tuning control lines are coupled to a phase frequency detector (PFD) to control the corresponding PMOS and NMOS switches and tuners according to a timing scheme, wherein the timing scheme coordinates turning on the PMOS and NMOS switches to charge and discharge a load capacitor of a loop filter coupled to the charge pump.

7. The charge pump of claim 2, wherein:
a substrate of the output PMOS transistor of the first current mirror is coupled to the supply voltage source; and
a substrate of the output NMOS transistor of the second current mirror is coupled to the reference voltage connection.

8. The charge pump of claim 2, wherein:
a substrate of the PMOS tuner is coupled to the supply voltage source; and
a substrate of the NMOS tuner is coupled to the reference voltage connection.

9. The charge pump of claim 2, further comprising:
a PMOS capacitor coupled between the supply voltage source and the first conductive link, wherein a gate of the PMOS capacitor is coupled to the first conductive link, and wherein the PMOS capacitor is configured to at least partially filter out voltage swings caused by clock feed-through and charge injection from operation of the PMOS switch; and
an NMOS capacitor coupled between the reference voltage connection and the second conductive link, wherein a gate of the NMOS capacitor is coupled to the second conductive link, and wherein the NMOS capacitor is configured to at least partially filter out voltage swings caused by clock feed-through and charge injection from operation of the NMOS switch.

10. The charge pump of claim 9, further comprising:
a PMOS matching transistor coupled between the supply voltage source and a source of the source PMOS transistor of the first current mirror, wherein a gate of the PMOS matching transistor is coupled to the reference voltage connection; and
an NMOS matching transistor coupled between the reference voltage connection and a drain of the source NMOS transistor of the second current mirror, wherein a gate of the NMOS matching transistor is coupled to the supply voltage source.

11. A phase locked loop (PLL) comprising:
a loop filter to generate an output voltage;
a voltage controlled oscillator (VCO) coupled to an output of the loop filter, the voltage controlled oscillator to generate an output signal with a known relationship to an input reference signal, wherein the voltage controlled oscillator generates the output signal based on the output voltage from the loop filter;
a detector coupled to an output of the voltage controlled oscillator, the detector to compare the output signal and the input reference signal and to generate at least one control signal to adjust the output signal generated by the voltage controlled oscillator; and
a charge pump coupled between an output of the detector and an input of the loop filter, the charge pump to charge and discharge a load capacitor within the loop filter in response to the control signal from the detector, wherein the charge pump comprises:
first and second current mirrors to serve as separate charge and discharge current sources, wherein each current mirror comprises a source MOS transistor and an output MOS transistor; and
MOS tuners coupled to the first and second current mirrors, wherein each MOS tuner comprises a transistor with a source coupled to a source of the corresponding output MOS transistor, and a drain coupled to gates of the corresponding source and output MOS transistors.

12. The PLL of claim 11, further comprising MOS switches coupled to the current mirrors, wherein each MOS switch comprises a transistor with a drain coupled to the source of the corresponding output MOS transistor of the corresponding current mirror.

13. The PLL of claim 11, further comprising a plurality of control lines coupled between the detector and the charge pump, wherein the detector is configured to generate a plurality of control signals and to transmit the control signals to the charge pump via the corresponding control lines, wherein the plurality of control signals comprise:
a charge control signal, UN, to control a PMOS switch to turn on the charge current source;
a discharge control signal, DP, to control an NMOS switch to turn on the discharge current source;
a first tuning control signal to turn on a PMOS tuner coupled to the PMOS switch and the charge current source during a state transition of the PMOS switch; and
a second tuning control signal to turn on an NMOS tuner coupled to the NMOS switch and the discharge current source during a state transition of the NMOS switch.

14. The PLL of claim 11, wherein:
the output MOS transistor of the charge current source comprises an output PMOS transistor, and a substrate of the output PMOS transistor is coupled to a supply voltage source; and
the output MOS transistor of the discharge current source comprises an output NMOS transistor, and a substrate of the output NMOS transistor is coupled to a reference voltage connection.

15. The PLL of claim 11, wherein:
the MOS tuner coupled to the first current mirror comprises a PMOS transistor, and a substrate of the PMOS transistor is coupled to a supply voltage source; and
the MOS tuner coupled to the second current mirror comprises an NMOS transistor, and a substrate of the NMOS transistor is coupled to a reference voltage connection.

16. The PLL of claim 11, wherein the detector comprises a phase frequency detector (PFD).

17. The PLL of claim 11, further comprising an N-divider coupled within a feedback path between the output of the voltage controlled oscillator and an input of the detector.

18. A method for operating a charge pump of a phase locked loop (PLL), the method comprising:
receiving a first tuning control signal;
turning on a PMOS tuner in response to the first tuning control signal, wherein the PMOS tuner comprises a PMOS transistor with a source coupled to a source of an output PMOS transistor of a source-switched charging current mirror, and a drain coupled to a gate of the output PMOS transistor of the source-switched charging current mirror;
receiving a charge control signal; and
turning on a PMOS switch while the PMOS tuner is turned on, wherein the PMOS switch is coupled to the source of the PMOS tuner and to the source of the output PMOS transistor of the source-switched charging current mirror, wherein turning on the PMOS switch facilitates charging a load capacitor within a loop filter of the PLL.

19. The method of claims 18, further comprising:

receiving a second tuning control signal;

turning on an NMOS tuner in response to the second tuning control signal, wherein the NMOS tuner comprises an NMOS transistor with a source coupled to a source of an output NMOS transistor of a source-switched discharging current mirror, and a drain coupled to a gate of the output NMOS transistor of the source-switched discharging current mirror;

receiving a discharge control signal; and turning on an NMOS switch while the NMOS tuner is turned on, wherein the NMOS switch is coupled to the source of the NMOS tuner and to the source of the output NMOS transistor of the source-switched discharging current mirror, wherein turning on the NMOS switch facilitates discharging the load capacitor within the loop filter of the PLL.

20. The method of claims 19, further comprising:

filtering out, via a PMOS capacitor coupled between a drain of the PMOS switch and the gate of the output PMOS transistor of the source-switched charging current mirror, voltage swing components caused by clock feed-through and charge injection from operation of the PMOS switch; and filtering out, via an NMOS capacitor coupled between a drain of the NMOS switch and the gate of the output NMOS transistor of the source-switched discharging current mirror, voltage swing components caused by clock feed-through and charge injection from operation of the NMOS switch.

* * * * *